United States Patent
Mallery et al.

[11] Patent Number: 6,145,735
[45] Date of Patent: Nov. 14, 2000

[54] THIN FILM SOLDER PASTE DEPOSITION METHOD AND TOOLS

[75] Inventors: Michael T. Mallery, Apalachin; James K. Lake, Endicott, both of N.Y.

[73] Assignee: Lockheed Martin Corporation, Bethesda, Md.

[21] Appl. No.: 09/150,673

[22] Filed: Sep. 10, 1998

[51] Int. Cl.[7] .................................................. B23K 35/12
[52] U.S. Cl. ............................................................. 228/254
[58] Field of Search ............................................. 228/254

[56] References Cited

U.S. PATENT DOCUMENTS

| | | | |
|---|---|---|---|
| 3,619,103 | 11/1971 | Williams et al. | 8/14 |
| 4,044,006 | 8/1977 | Weil | 544/67 |
| 4,372,475 | 2/1983 | Goforth et al. | |
| 4,510,274 | 4/1985 | Okazaki et al. | 523/41 |
| 4,529,836 | 7/1985 | Powers et al. | 174/94 |
| 4,561,726 | 12/1985 | Goodby et al. | 350/341 |
| 4,650,107 | 3/1987 | Keser | |
| 4,684,055 | 8/1987 | Baer et al. | 228/180.1 |
| 4,898,320 | 2/1990 | Dunaway et al. | 228/245 |
| 5,310,574 | 5/1994 | Holzmann | |
| 5,395,040 | 3/1995 | Holzmann | |
| 5,437,754 | 8/1995 | Calhoun | 156/231 |
| 5,492,266 | 2/1996 | Hoebener et al. | 228/248.1 |
| 5,539,153 | 7/1996 | Schwiebert et al. | 174/260 |
| 5,586,007 | 12/1996 | Funada | 361/720 |
| 5,643,831 | 7/1997 | Ochiai et al. | 437/183 |
| 5,660,321 | 8/1997 | Ishida et al. | 228/248.1 |
| 5,820,450 | 10/1998 | Calhoun | 451/530 |

*Primary Examiner*—Patrick Ryan
*Assistant Examiner*—Zidia S. Pittman
*Attorney, Agent, or Firm*—Whitham, Curtis & Whitham

[57] ABSTRACT

Solder is deposited on chip elements or other potentially irregular surfaces by applying solder paste to a thin porous sheet such as cotton twill cloth so that the solder paste fills open areas therein. The solder volume is thus regulated by the texture and structure of the porous sheet. The porous sheet is then placed in compression against the surface to which solder is to be applied and the solder in the solder paste reflowed in an oven, preferably including a nitrogen atmosphere. At the same time, excess flux is absorbed by the porous sheet to facilitate subsequent cleaning while the reflow of solder is accurately and repeatably controlled. The process and resulting structure are particularly appropriate to the manufacture of discrete electronic devices which include an array of chip components such as capacitor chips sandwiched between plate structures. The process and structure also provides highly repeatable, high quality solder connections between curved surfaces.

12 Claims, 2 Drawing Sheets

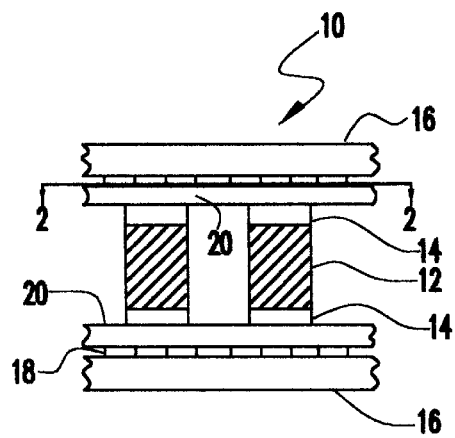
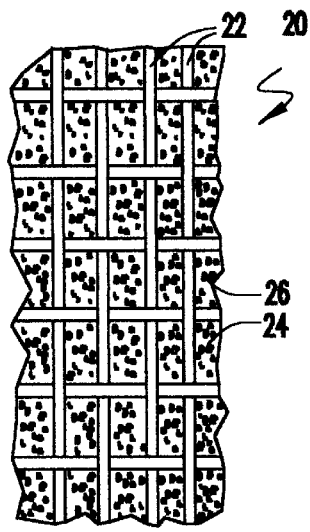
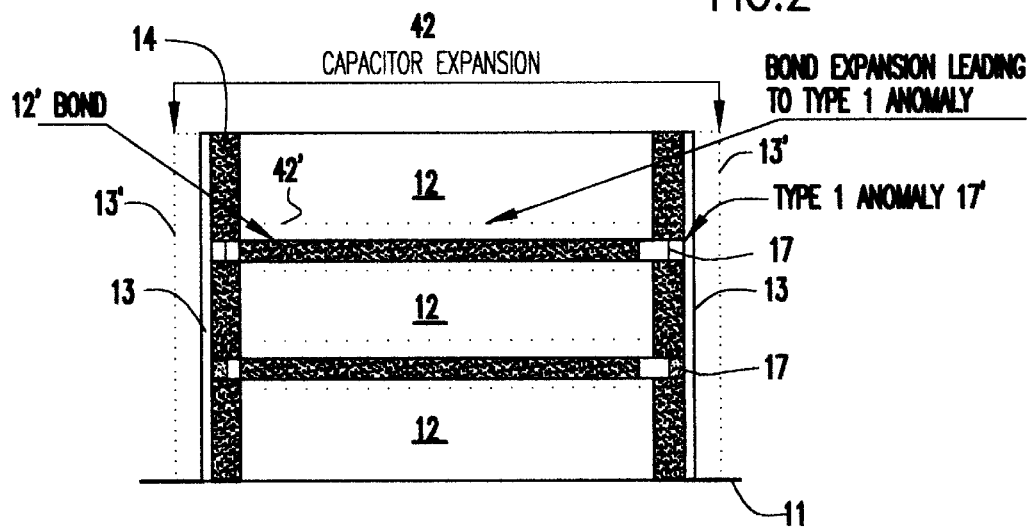
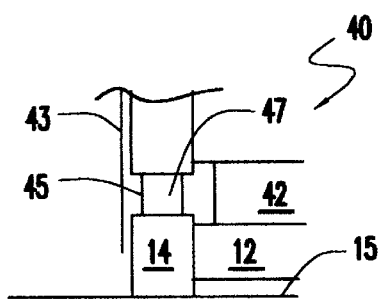
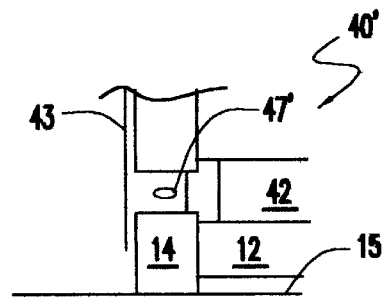
FIG.1A
FIG.2
FIG.1B
FIG.1C
FIG.4

THIN FILM SOLDER PASTE DEPOSITION METHOD AND TOOLS

DESCRIPTION

This invention was made with U.S. government support under contract IWTA XK-34-00063 awarded by the U.S. government. The government has certain rights in this invention.

BACKGROUND OF THE INVENTION

1. Field of the Invention

The present invention generally relates to the manufacture of discrete electronic components and, more particularly, to the application of solder to elements included therein such as for formation of connections between a plurality of chip elements and common electrode connections of the device.

2. Description of the Prior Art

While there has been much development of technologies allowing increased device density and variety in integrated circuits in recent years, there remain many applications in electronic devices for which discrete devices are required. In many cases, the needed value of a resistance, capacitance or inductance simply cannot be achieved in a manner consistent with integrated circuit design. In other cases, a discrete device is required to provide sufficient thermal mass or heat dissipation to accommodate currents that the component may be required to carry. Many new technologies and materials have also been developed to improve performance and stability of electrical characteristics of discrete devices while generally reducing size and weight and increasing structural integrity thereof.

Among these technologies, it has become the practice for some types of discrete devices to provide for inclusion of a plurality of more-or-less standardized elements or "chips" in parallel or some other common connection arrangement (e.g. serial and parallel connections in networks to increase heat dissipation). In particular, much increased quality of capacitors in terms of long term stability, breakdown voltage, tolerance and the like has been achieved by the provision of a plurality of chips of specially processed tantalum, barium titanate or other material (to achieve a texture having a high surface area to volume ratio) in parallel between common terminals or connections. The value of the resulting discrete capacitor is thus established as the sum of capacitances of individual chips.

Of course, in this type of discrete device, it is generally preferred to make electrical and mechanical connections between the chips and the common electrodes by soldering since solder metallurgy is well-developed and understood and known to provide mechanically robust, low-resistance connections. However, since the chips are closely spaced to achieve a compact discrete device, the location of the majority of solder joints are made inaccessible, particularly if a plate-type common electrode is used. Therefore, other techniques of assembly and formation of connections (e.g. conductive pastes or adhesives) have often been employed. Nevertheless, construction of such devices using solder pastes together with ovens to achieve solder fusion is known but requires sophisticated and costly solder deposition techniques and operations.

Solder paste deposition has been generally achieved by screening of a paste comprising solder materials in a finely powdered form, an appropriate flux and a binder. The screening process generally has involved the use of costly and delicate metal stencil masks, generally only 0.002 inches thick, which can be easily damaged by contact with the surfaces of discrete chips and which are subjected to wear and other damage by structures adapted to extrude the solder paste therethrough. Moreover, a unique screening mask is generally necessary for each chip layout in number and arrangement of chips. That is, a screening mask must be fabricated for every value and stack configuration of resistor or capacitor which it is desired to produce.

Further, screening using a stencil mask generally results in irregular solder paste application and resultant solder volumes, as deposited or in the completed device. The solder volume is often relatively critical to develop a small solder extrusion or meniscus ideally surrounding and/or filling the solder joint, commonly referred to as a "fillet", at each solder connection, as illustrated at 17 of FIG. 1B. The fillets ideally engender good structural robustness while accommodating some degree of variation in physical dimensions of the chips although the corresponding volume of solder is somewhat greater than necessary for adequate electrical connections to be made. However, the solder volume is also somewhat critical since the excess amount of solder must not be so great as to cause shorting or compromise of the electrical properties of the chip elements. Further, the volume of solder forming the fillet must be controlled within an empirically determined range of volume since mechanical strength will be maximized over a relatively limited range of volume and a tendency toward cracking of the solder joint or the development of voids will increase dramatically with the cycling of mechanical and/or thermal stress if too much or too little solder is present in the joint, as will be discussed in greater detail below.

Moreover, using a screening stencil mask requires two separate operations to deposit paste on opposing surfaces of the chips or on the corresponding sides of the plate electrodes. After completion, flux must generally be removed to avoid corrosion of the device and/or chip elements by the active materials in the flux which, by their nature, attack oxides and can thus compromise stability of electrical characteristics.

Therefore, it can be readily appreciated that known solder deposition processes are costly, inconsistent in results and require significant time and specialized tooling and machinery to accomplish. Thus, known processes for deposition of solder are inadequate to insure high quality and manufacturing yield of such discrete components. Moreover, production of such discrete components is limited by throughput of the solder deposition tools.

SUMMARY OF THE INVENTION

It is therefore an object of the present invention to provide a technique for solder deposition which has a reduced number of operational steps, which avoids special tooling or machinery and which provides increased consistency of results while yielding solder bonds of low electrical resistance and high mechanical integrity and robustness.

In order to accomplish these and other objects of the invention, open areas in a porous sheet material such as a thin cloth are filled with solder paste and stacked with device elements to which solder is to be applied, after which the application of solder material is completed by heating the stacked plates, solder paste filled sheet material and elements a temperature above the fusion temperature of the solder.

In accordance with another aspect of the invention, a discrete electronic component is provided which is fabricated by the steps of filling a porous sheet with solder paste, locating the porous sheet against a surface to which solder is to be applied, reflowing solder in the solder paste to apply solder to the surface, removing the porous sheet from the surface, and forming a solder connection between said surface and another surface.

BRIEF DESCRIPTION OF THE DRAWINGS

The foregoing and other objects, aspects and advantages will be better understood from the following detailed description of a preferred embodiment of the invention with reference to the drawings, in which:

FIG. 1A is a cross-sectional view of an assembly for application of solder in accordance with the invention, FIG. 1B is a cross-sectional view of a stacked chip capacitor, FIG. 1C is an enlarged cross-sectional view of a portion of a capacitor such as that shown in FIG. 1B using solder application techniques other than those in accordance with the invention, FIG. 2 is a plan view (or section at 2—2 of FIG. 1) of the solder paste-filled sheet material in accordance with the invention, FIG. 4 is an enlarged sectional view corresponding to that of FIG. 1C formed in accordance with the invention and after substantial thermal cycling.

DETAILED DESCRIPTION OF A PREFERRED EMBODIMENT OF THE INVENTION

Figure 3:
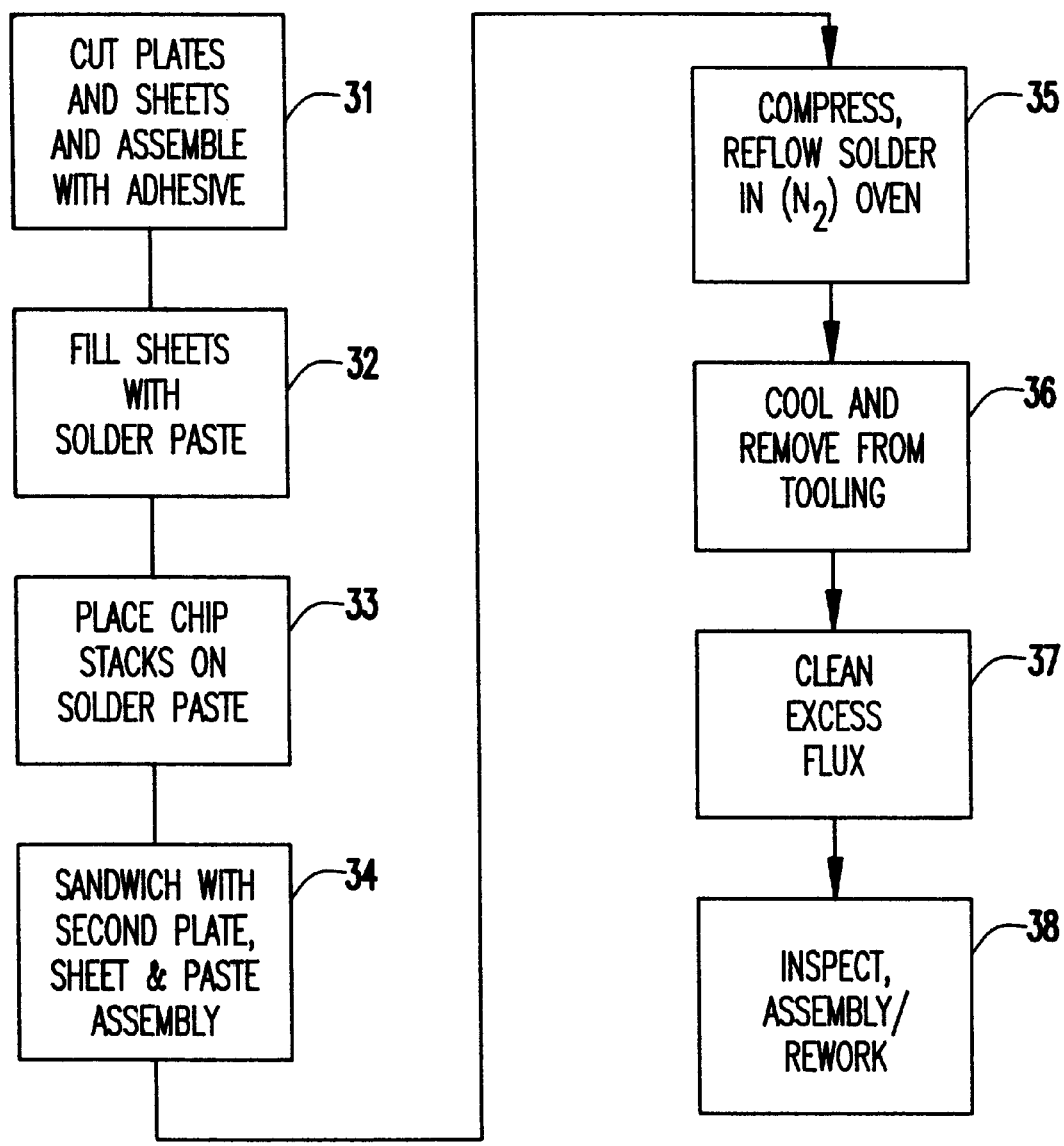
FIG. 3 is a flow chart illustrating the methodology of the component construction methodology in accordance with the invention.

Referring now to the drawings, and more particularly to FIG. 1, there is shown, in cross-section, an assembly 10 for application of solder to chip elements in accordance with the invention. Chip components 12 are provided with metallization on surfaces where solder is to be applied and a solder bond is to be ultimately formed. The construction in accordance with the invention further includes a thin (e.g. 0.001") adhesive layer 18, preferably of an acrylic type and applied as a spray, and a solder paste-filled thin porous sheet 20 interposed between each plate 16 and chip metallization 14.

It should be appreciated that while the assembly 10 may resemble a possible structure of completed discrete electronic components, an example of which is shown in FIG. 1B, the plates 16 and porous material are removed from the chip elements 12 after the solder application thereto is completed. The chip elements can then be soldered together and may also be soldered to common connection plates or, preferably, to a ceramic substrate 11, in any desired array or configuration and accommodation of the chip array by the solder application processes, such as the screening process described, above is thus avoided, as will be described in greater detail below. The chip elements can also be soldered to common connection plates.

It is to be understood that while the gross structure and relative orientation of elements shown in FIG. 1B reflects a known design (but which is not admitted to be prior art in regard to the present invention), when solder is applied to those elements by screening or other known techniques, certain defects or anomalies will occur either spontaneously or under conditions of use. Accordingly, but for these anomalies indicated at 17', the depiction of FIG. 1B is also illustrative of an exemplary capacitor formed in accordance with the invention; the distinguishing details thereof being compared to prior constructions and at an increased size in FIGS. 1C and 4.

Specifically, the capacitor structure shown in FIG. 1B includes a stack of three capacitor elements 12 having metallization 14 and which are assembled by bonding 12' into a stack. The elements of the stack are soldered together by fillets 17.

It should be appreciated that the coefficients of thermal expansion of the capacitor elements 12, the bond material 12' and the substrate 11 cannot be exactly matched and, further, their temperatures cannot be maintained the same at all times, even though they are closely spaced. The resultant differences in dimensional changes for an arbitrary change in temperature is thus shown for element boundaries 42 and 13 by dotted lines 42' and 13', respectively. More specifically, expansion of bond material 42 alters the thickness of the bond and the spacing between the chip elements 12 and the metallization 14, thereon, which results in tension in solder between metallizations 14.

The combination of shearing and tension at the solder bonds between chip elements 12 may cause the development of large voids 47 and/or cracks 45 (both shown in FIG. 1C) in fillet 17 and solder coating 43, collectively referred to as type 1 anomalies 17'. This type of anomaly decreases the cross-sectional area for electrical conduction and thermal transfer, tending to increase differences in temperature among the elements of the component and to increase resistive heating in the solder bonds. The occurrence of these anomalies is much reduced in frequency and severity of effect by the method of solder application in accordance with the present invention.

Specifically, and returning to the illustration of FIG. 1A, porous sheet 20 is preferably a thin, open-weave fabric such as cotton twill cloth woven from 2 mil diameter thread. Other materials such as perforated paper will be recognized as suitable for the purpose, as well, by those skilled in the art. The only requirements are that the material should be able to retain its original texture at the temperature required for fusion of the solder composition employed and having as great a proportion of open area as possible while opening dimensions are sufficiently small to maintain solder therein by surface tension.

The thin layer of adhesive 18 (which need not be continuous) adheres the sheet material 20 to plate 16 and serves to stabilize the porous sheet material during application of solder paste and between the time of assembly or "sandwiching" of the above-described elements of the device and the time of fusion of the solder to complete the application of solder to the chip stack elements. A woven texture is preferred since the adhesive 18 will then adhere to only portions of thread raised into contact therewith by the texture of the weave to facilitate separation of the elements from the plates after solder application is complete. A material having tensile strength comparable to cloth of the above specifications, such as is engendered by relatively long fibers therein, is also preferred for clean separation after solder fusing, as will be described below.

FIG. 2 can be understood as a greatly enlarged plan view of the solder paste-filled sheet 20 or as a greatly enlarged sectional view of the structure of FIG. 1 taken at section 2—2. The open area 24 of porous sheet 20 (e.g. between threads 22) is preferably at least one-third of the total area of the sheet to provide a sufficient solder volume for a mechanically robust bond. In this regard and while it is to be clearly understood that FIGS. 1 and 2 are not drawn to scale, the size at which FIG. 2 is depicted is approximately one hundred times larger than the size at which FIG. 1 is depicted.

The solder paste is preferably applied to the sheet 20 by a spatula, squeegee, roller or the like type of device or even by a nozzle in the manner of screening through a mask. The only requirement is that the viscous solder paste be pressed into the open area of sheet material 20 to substantially fill the texture of the material. A smaller amount of solder paste can be employed in consideration of the compressibility of the sheet material 20 as will be understood by those skilled in the art and that the term "filling" as used herein to describe the amount of solder paste applied to sheet 20 need not be the maximum amount of solder paste which can be retained therein. It can readily be appreciated that the application process is entirely non-selective and the solder paste can be deposited over the entirety of the sheet, regardless of the configuration of the chip component placement on the plates 16. Therefore, no mask or special tooling or machinery are required in the practice of the invention and separate screening operations are avoided altogether.

The solder paste may be freely formulated both as to metal proportions or structure of solder particles in the paste. For example, the proportions of metals can be freely chosen and included in the paste as a mixture of powders and/or as coatings on the particles to determine solder fusion temperature. Similarly, the flux included in the paste can be freely chosen but RMA (rosin, mildly activated) and water-soluble fluxes are generally preferred to allow cleaning and removal thereof after solder fusion. In this regard, use of a woven material and cotton, in particular, tends to soak up excess flux and results in better control of flux movement and cleanliness of the structure prior to processes for removing excess flux from the chip elements. The binder is similarly not critical to the practice of the invention and may include one or more thixotropic agents and other materials to adjust surface tension and thus enhance retention of the paste within the open areas of the sheet 20.

It is considered preferable to affix pieces of the sheet 20 to conveniently sized plates 16 (e.g. four inches square) with adhesive layer 18 and then apply solder paste thereto with a spatula or squeegee. This allows avoidance of paste voids against plates 16 which would adversely affect manufacturing yields while providing for easy handling of the very thin sheet material 20 and avoidance of excessive waste of either the sheet material or the solder paste.

Referring now to FIG. 3, a preferred method of applying solder to chip elements utilizing the structure of FIG. 1 will now be discussed. Initially, it is preferred that the plates 16 and sheets 20 be assembled together with adhesive layer 18 and formed to a convenient size to facilitate handling, as shown at 31, prior to filling of sheet 20 with solder paste 26. The order of cutting of plates 16 and sheets 20 and assembly is not important to the practice of the invention.

It is somewhat preferred as a matter of avoiding material waste and reducing alignment operations to adhere sheet 20 to plate 16 with an acrylic adhesive 18 prior to cutting. As alluded to above, adhesive 18 is preferably applied to plates 16 as a spray since the adhesive layer need not be continuous and the volume of adhesive should be limited to avoid any significant amount of adhesive being absorbed by the porous material (which might otherwise limit the capacity of the porous material 20 to absorb excess flux). However, the reverse order may be preferable in some instances or dictated by commercially available sizes of materials or apparatus. In any event, for compressing the assembled structure and reflowing solder in an oven, a size of about four inches square is currently preferred.

Once the sheets 20 are affixed to plates 16, the sheets can be easily filled with solder paste in a simple operation with non-critical tools, as depicted at 32. As alluded to above, applying solder paste manually with a spatula is adequate to the practice of the invention by squeezing the paste 24 into the open areas 26 in the sheet 20 and screeding away the excess above the texture of sheet 20. The texture of porous sheet 20 thus provides a high degree of uniformity of solder volume even for a simple, manual process. However, further improved uniformity of paste application may potentially be achieved by a simple automated process using a squeegee, rollers, nozzle or the like. Then, as depicted at 33, the chip stacks 12 are placed on the solder paste in any array and density that may be desired. However, some spacing between the chips should be provided to prevent the chips from becoming soldered together during the subsequent solder fusing process.

As shown at 34, a complementary and opposing plate, sheet and solder paste assembly is placed over the chip stacks 12 to form the sandwich structure of FIG. 1. This sandwich structure is then placed in compression (e.g. by a clamping tool or fixture, the design of which is unimportant to the practice of the invention) and loaded into an oven, as shown at 35, for reflowing the solder in the solder paste. It is preferred but not essential to the practice of the invention to utilize a non-reactive atmosphere such as nitrogen or an inert gas during heating of the assembly to a temperature above the fusion temperature of the solder alloy chosen. (A non-reactive atmosphere generally avoids compromise of the electrical properties of the chip components which are, themselves, generally formed by a thermal treatment.) This temperature is maintained for thirty to ninety seconds after which the assembly is allowed to cool, as illustrated at 36. At any temperature significantly below the fusion point of the solder alloy, the assembly 10 can be removed from the oven and the compression tool removed.

The plates 16 and cloth 20 are then readily separated from the chip elements since the texture of the porous sheet material 20 provides both an interface which facilitates parting of the chip elements 12 from the plates 16 and establishes the volume and distribution of solder which is now fused to metallization 14. Additionally, it is preferred that plates 16 be formed of a non-solder-wettable material to further facilitate separation from the chip elements 12. The chip elements 12 can then be subjected to any desired cleaning process 37 to remove flux and other constituent materials of the solder paste which do not contribute to solder bonds which may later be made in the fabrication of discrete electronic components.

After inspection and/or testing, the electronic chip elements having solder applied thereto by the above-described method can then be assembled into any desired array of configuration and the solder again fused to form connections among the chip elements and common connections thereto as may be desired in a discrete component as depicted at 38. The discrete devices thus formed are preferably tested and reworked if necessary since the solder materials can be fused any desired number of times to separate or reassemble the discrete component.

For example, if the general configuration of FIG. 1B is utilized for a discrete component formed in accordance with the invention, the anomalies 17' will be markedly reduced in frequency of occurrence or severity of effect. In practice, it has been found that the solder volume is sufficiently well-regulated in the fillets such that cracking is substantially eliminated even without further adjustments or compensation of respective coefficients of thermal expansion beyond those currently employed. Some voids 47' have been found to occur employing the invention but are much smaller than voids 47 (FIG. 1C) formed in components fabricated by previously known techniques. Importantly, the smaller voids 47' do not significantly contribute to increased resistive heating in the solder bonds.

In view of the foregoing, it is seen that the use of a porous sheet material such as cotton twill cloth filled with solder paste regulates the volume of solder applied to chip stack elements to facilitate the formation of fillets by surface tension and control of solder reflow to avoid shorting. No special tooling, customized masks or multiple deposition processes are required and the production process in accordance with the invention is not limited by throughput of complex machines. It should also be appreciated that the process and structure in accordance with the invention is not limited to discrete components or planar surfaces. It is considered, for example, that the invention is not limited to generally planar plates but provides a reliable method of depositing solder on curved and irregular plate structures or surfaces of elements in numerous applications where the solder bond to be formed is inaccessible and allowing a robust and low resistance solder connection to be formed with high precision, regularity, uniformity and repeatability without specialized machinery or tooling.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of applying solder to a surface including the steps of filling a porous sheet with solder paste, compressing said porous sheet against said surface, and reflowing solder in said solder paste on said surface from said paste filling said porous sheet.

2. A method as recited in claim 1, wherein said surface is a surface of a chip element.

3. A method as recited in claim 1, wherein said porous sheet is a woven fabric.

4. A method as recited in claim 3, wherein said woven fabric is cotton twill cloth.

5. A method as recited in claim 3, wherein said woven fabric is woven from 2 mil thread.

6. A method as recited in claim 1, including the further steps of applying an adhesive to a plate, and adhering said porous sheet to said plate.

7. A method as recited in claim 1, wherein said filling step is performed by pressing said solder paste into said porous sheet.

8. A method as recited in claim 7, wherein said solder paste is pressed into said porous sheet with a squeegee.

9. A method as recited in claim 7, wherein said solder paste is pressed into said porous sheet with a nozzle.

10. An electronic device formed by a method including the steps of filling a porous sheet with solder paste, locating said porous sheet against a surface to which solder is to be applied, reflowing solder in said solder paste to deposit solder on said surface, and forming a solder bond between said surface and another surface.

11. An electronic device as recited in claim 10, wherein said surface to which solder is to be applied is metallization on a chip element.

12. An electronic device as recited in claim 11, wherein said chip element is a capacitor chip.

\* \* \* \* \*